(12) United States Patent
Kudo (10) Patent No.: US 10,193,685 B2
(45) Date of Patent: Jan. 29, 2019

(54) RECEPTION CIRCUIT AND SEMICONDUCTOR INTEGRATED CIRCUIT

(71) Applicant: SOCIONEXT INC., Yokohama-shi, Kanagawa (JP)

(72) Inventor: Masahiro Kudo, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/698,044

(22) Filed: Sep. 7, 2017

(65) Prior Publication Data

US 2018/0102897 A1    Apr. 12, 2018

(30) Foreign Application Priority Data

Oct. 6, 2016 (JP) .................................. 2016-198308

(51) Int. Cl.
| | |
|---|---|
| H04L 25/00 | (2006.01) |
| H04L 7/00 | (2006.01) |
| H03L 7/087 | (2006.01) |
| H03L 7/089 | (2006.01) |
| H04L 7/033 | (2006.01) |

(Continued)

(52) U.S. Cl.
CPC ............ *H04L 7/0087* (2013.01); *H03L 7/087* (2013.01); *H03L 7/0891* (2013.01); *H04L 7/0337* (2013.01); *H04L 25/03019* (2013.01); *H04L 25/4917* (2013.01)

(58) Field of Classification Search
USPC ................................................. 375/320, 340
See application file for complete search history.

(56) References Cited

U.S. PATENT DOCUMENTS

| | | | |
|---|---|---|---|
| 9,699,009 B1 * | 7/2017 | Ainspan | .............. H04L 25/4917 |
| 2005/0201491 A1 | 9/2005 | Wei | |
| 2011/0311008 A1 | 12/2011 | Slezak et al. | |

(Continued)

FOREIGN PATENT DOCUMENTS

| | | |
|---|---|---|
| JP | 2006-254261 A | 9/2006 |
| JP | 2014-060583 A | 4/2014 |

OTHER PUBLICATIONS

Extended European Search Report of related European Patent Application No. 17190648.0 dated Feb. 13, 2018.

(Continued)

*Primary Examiner* — Kevin Kim
(74) *Attorney, Agent, or Firm* — Arent Fox LLP (57) ABSTRACT

A reception circuit includes a determination circuit including comparator circuits configured to determinate a level of a received signal and a logic circuit configured to generate a digital signal based on outputs of the comparator circuits. The determination circuit is configured to determinate by a first number of the comparator circuits when the received signal is a first signal which is a multi-valued signal and determinate by a second number of the comparator circuits, the second number being smaller than the first number, when the received signal is a second signal. The logic circuit is configured to operate as a decoder which decodes outputs of the comparator circuits and generates the digital signal when the received signal is the first signal, and operates as a selector which selects an output of the comparator circuit for generating the digital signal when the received signal is the second signal.

19 Claims, 5 Drawing Sheets

(51) Int. Cl.
*H04L 25/03* (2006.01)
*H04L 25/49* (2006.01)

(56) References Cited

U.S. PATENT DOCUMENTS

2015/0222418 A1   8/2015   Akita et al.
2016/0191276 A1   6/2016   Sakai et al.

OTHER PUBLICATIONS

Stojanovic, V., et al., Autonomous Dual-Mode (PAM2/4) Serial Link Transceiver With Adaptive Equalization and Data Recovery, IEEE Journal of Solid-State Circuits, vol. 40, No. 4, pp. 1012-1026, IEEE Service Center, Piscataway, NJ, USA, Apr. 1, 2005.

\* cited by examiner

F I G. 1

F I G. 2

F I G. 3

F I G. 4A

F I G. 4B

| INPUT | BINARY OUTPUT | GRAY OUTPUT |
|-------|---------------|-------------|
| 000   | 00            | 00          |
| 001   | 01            | 01          |
| 011   | 10            | 11          |
| 111   | 11            | 10          |

RECEPTION CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2016-198308, filed on Oct. 6, 2016, the entire contents of which are incorporated herein by reference.

FIELD

The embodiments discussed herein are directed to a reception circuit and a semiconductor integrated circuit.

BACKGROUND

Figure 6:
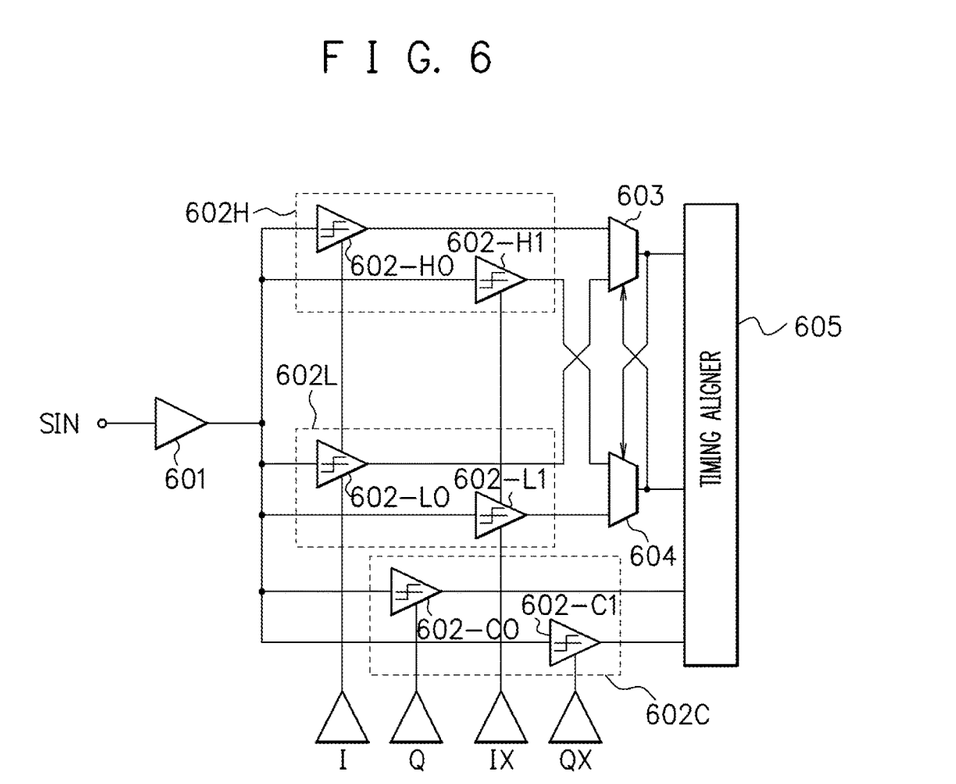
FIG. 6 is a diagram illustrating a configuration example of a front end unit of an NRZ reception circuit.

FIG. 6 illustrates a configuration example of a front end unit of a reception circuit of a serializer/de-serializer (SerDes). FIG. 6 illustrates an example of an NRZ (Non Return to Zero) reception circuit which receives a binary NRZ signal of "0" or "1". In the reception circuit illustrated in FIG. 6, an amplifier 601 amplifies a binary NRZ signal SIN inputted to a serial signal input terminal, and comparators 602-L0 and 602-L1 which a comparator circuit 602L includes and comparators 602-H0 and 602-H1 which a comparator circuit 602H includes each perform determination of "0" and "1" and output a determination result.

In FIG. 6, an example of a half-rate configuration in which data is sampled in a half cycle of a data rate by the comparators 602-L0, 602-L1, 602-H0, and 602-H1 is illustrated. Further, an example of a configuration in which boundary detection related to the binary NRZ signal is performed by comparators 602-C0 and 602-C1 which a comparator circuit 602C includes and a clock data recovery circuit operates with a phase comparator by 2× sampling is illustrated. Therefore, as illustrated in FIG. 6, four-phase clocks I, Q, IX, and QX corresponding to phases of 0 degrees, 90 degrees, 180 degrees, and 270 degrees respectively are supplied. Operation timings of the comparators 602-L0, 602-L1, 602-H0, and 602-H1 which determine data of the binary NRZ signal are controlled based on the clocks I and IX, and operation timings of the comparators 602-C0 and 602-C1 which perform edge determination of data for phase detection of clock data recovery are controlled based on the clocks Q and QX.

In the example illustrated in FIG. 6, in order to remove an effect due to inter symbol interference (ISI) of data which occurs in a transmission path and heighten reception accuracy, a decision feedback equalizer (DFE) which compensates a signal loss due to the inter symbol interference based on a determination result of past data is applied. In FIG. 6, in order to compensate the effect due to the inter symbol interference after 1 unit interval (UI), a one-tap DFE which compensates the signal loss due to the inter symbol interference based on data before 1 UI is applied.

In FIG. 6, a determination level of the comparators 602-L0 and 602-L1 which the comparator circuit 602L includes and a determination level of the comparators 602-H0 and 602-H1 which the comparator circuit 602H includes are deviated, and based on a previous determination result which is before 1 UI, a determination result of the comparator which is to be selected is selected by selectors 603 and 604 provided in a subsequent stage of the comparators. The selected data is used for selection determination of data after next 1 UI.

For example, determination results of the comparator 602-L0 and the comparator 602-H0 are inputted to the selector 603. When output data of the selector 604 which is a determination result before 1 UI is "0", the selector 603 selects the determination result of the comparator 602-L0, which is outputted as output data, and when the output data of the selector 604 is "1", the selector 603 selects the determination result of the comparator 602-H0, which is outputted as output data. Further, for example, determination results of the comparator 602-L1 and the comparator 602-H1 are inputted to the selector 604. When output data of the selector 603 which is a determination result before 1 UI is "0", the selector 604 selects the determination result of the comparator 602-L1, which is outputted as output data, and when the output data of the selector 603 is "1", the selector 604 selects the determination result of the comparator 602-H1, which is outputted as output data.

Data is sampled alternately in the reception circuit with the half-rate configuration in this manner, thereby resulting in a determination result of a comparator in which data before 1 UI is operated in a phase opposite to a target comparator and allowing the reception circuit of the one-tap DFE to be configured by a simple configuration as illustrated in FIG. 6. A timing aligner 605 synchronizes data to be inputted at a timing corresponding to each of the four-phase clocks I, Q, IX, and QX and different from one another with a single clock and outputs the data. This makes it possible that a not-illustrated demultiplexer in a subsequent stage performs data processing in the single clock.

Figure 7:
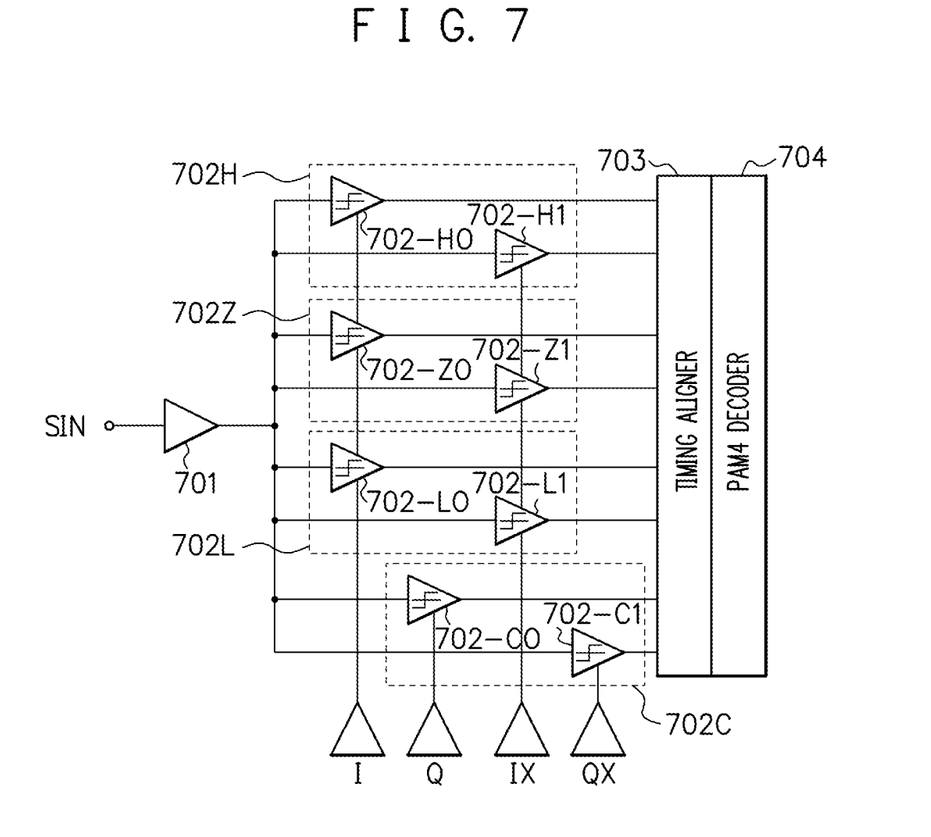
FIG. 7 is a diagram illustrating a configuration example of a front end unit of a PAM4 reception circuit.

FIG. 7 illustrates another configuration example of a front end unit of a reception circuit of a serializer/de-serializer. FIG. 7 illustrates an example of a pulse amplitude modulation 4 (PAM4) reception circuit which receives not the binary NRZ signal but a 4-valued pulse amplitude modulation signal referred to as PAM4. In the PAM4 reception circuit illustrated in FIG. 7, an amplifier 701 amplifies a 4-valued PAM4 signal SIN inputted to a serial signal input terminal, and comparators 702-L0 and 702-L1 which a comparator circuit 702L includes, comparators 702-Z0 and 702-Z1 which a comparator circuit 702Z includes, and comparators 702-H0 and 702-H1 which a comparator circuit 702H includes determine data at three determination levels, thereby determining an input signal as a 3-bit thermometer code. Thermometer codes to be obtained, of "000", "001", "011", and "111" correspond to four values of 0, 1, 2, and 3 respectively, and a logic circuit (PAM4 decoder) 704 to which the thermometer codes are inputted via a timing aligner 703 performs this conversion.

Also in FIG. 7, an example of a configuration in which data is sampled in a half cycle of a data rate is illustrated. Further, an example of a configuration in which boundary detection related to the 4-valued PAM4 signal is performed by comparators 702-C0 and 702-C1 which a comparator circuit 702C includes and a clock data recovery circuit operates with a phase comparator by 2× sampling is illustrated. Operation timings of the comparators 702-L0, 702-L1, 702-Z0, 702-Z1, 702-H0, and 702-H1 which determine data of the 4-valued PAM4 signal are controlled based on the clocks I and IX, and operation timings of comparators 702-C0 and 702-C1 which perform boundary detection for phase detection of clock data recovery are controlled based on clocks Q and QX.

There has been proposed a clock data recovery (CDR) circuit which has both functions of a CDR circuit of a phase locked loop method and a CDR circuit of an over-sampling method and allows switching between both the methods (refer to Patent Document 1). There has been proposed a communication semiconductor integrated circuit in which a ΔΣ (sigma-delta) type analog-digital conversion circuit capable of changing the number of operating comparators among comparators configuring a quantizer according to a communication system, and obtaining a desired noise shape characteristic while corresponding to two communication systems is built (refer to Patent Document 2).

Patent Document 1: Japanese Laid-open Patent Publication No. 2014-60583

Patent Document 2: Japanese Laid-open Patent Publication No. 2006-254261

A PAM4 signal is capable of communicating data of two bits in one symbol, and therefore it is possible to achieve a double data rate in the PAM4 signal compared with an NRZ signal, but on the other hand, the NRZ signal is excellent in reception accuracy due to a large eye opening compared with the PAM4 signal. It is preferable that communication can be performed by selecting an appropriate modulation method according to a communication situation such as a transmission line and a size of crosstalk in order to take advantage of the features of the respective signals, but when circuits corresponding to the respective modulation methods are each provided, a circuit scale becomes large.

SUMMARY

One aspect of a reception circuit includes: a determination circuit including a first number of comparator circuits configured to perform determination of a level of a received signal; and a logic circuit configured to generate a digital signal based on outputs of the comparator circuits. The determination circuit is configured to perform determination by using the first number of the comparator circuits when the received signal is a first signal which is a multi-valued signal and to perform determination by using a second number of the comparator circuits, the second number is smaller than the first number, when the received signal is a second signal. A number of possible values of the second signal is smaller than a number of possible values of the first signal. The logic circuit is configured to operate as a decoder which decodes outputs of a plurality of the comparator circuits and generates the digital signal when the received signal is the first signal, and to operate as a selector which selects an output of the comparator circuit which is used for generation of the digital signal when the received signal is the second signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter embodiments will be described with reference to the drawings.

Figure 1:
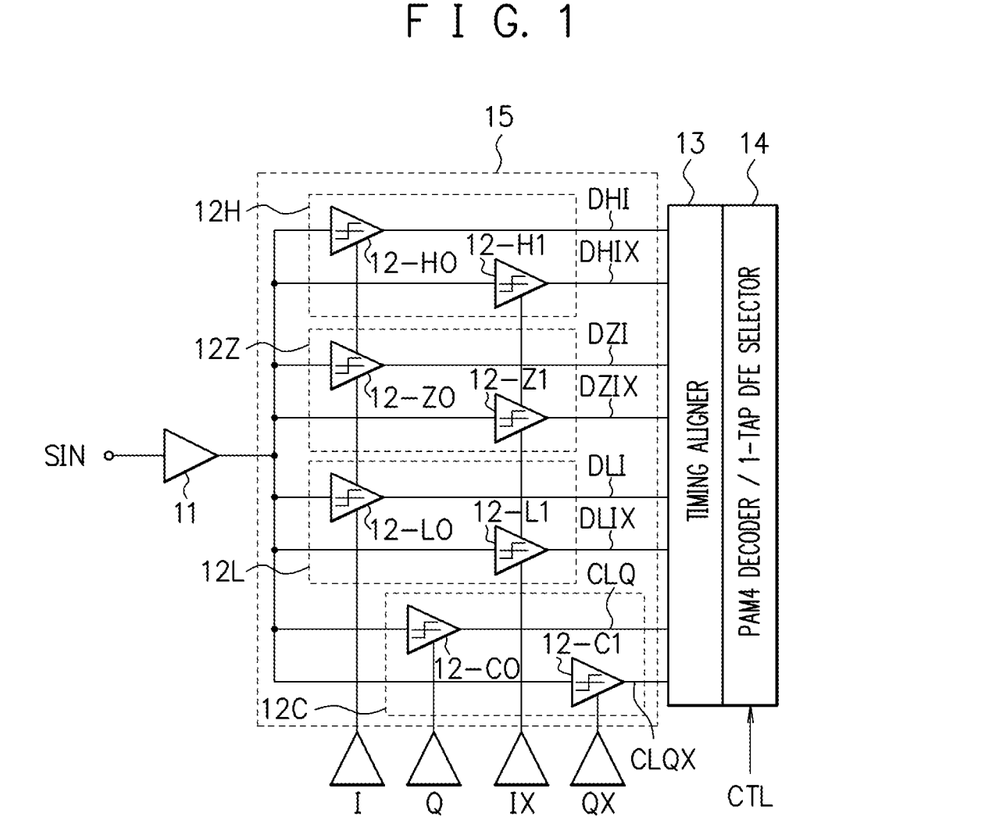
FIG. 1 is a diagram illustrating a configuration example of a front end unit of a reception circuit in an embodiment.

FIG. 1 is a diagram illustrating a configuration example of a front end unit of a reception circuit in an embodiment. FIG. 1 illustrates an example of a reception circuit capable of treating a binary non return to zero (NRZ) signal of "0" or "1", and a 4-valued pulse amplitude modulation 4 (PAM4) signal of "00", "01", "10", and "11".

An amplifier circuit 11 amplifies a received serial signal SIN to be inputted from a serial signal input terminal. The signal amplified by the amplifier circuit 11 is inputted to a determination circuit 15. The determination circuit 15 includes comparator circuits 12L, 12Z, and 12H for data determination, and a comparator circuit 12C for boundary detection for phase detection of clock data recovery, and the signal amplified by the amplifier circuit 11 is inputted to the comparator circuits 12L, 12Z, and 12H for data determination and the comparator circuit 12C for boundary detection for phase detection of clock data recovery. In this embodiment, the determination circuit 15 includes the three comparator circuits 12L, 12Z, and 12H for data determination, and this is because the binary NRZ signal and the 4-valued PAM4 signal are treated. When the one having the maximum number of signal levels among pulse amplitude modulation signals to be received is an N-valued PAM signal, the determination circuit 15 may include (N−1) or more comparator circuits for data determination.

Each of the comparator circuits 12L, 12Z, and 12H includes comparators of ratio numbers of frequency of a comparison cycle of a comparator to a symbol rate of data. For example, in a case of a half-rate operation in which the comparator operates at a rate half of the symbol rate, each of the comparator circuits 12L, 12Z, and 12H includes two comparators. In this embodiment, an example of a half-rate configuration is given, and the comparator circuit 12L includes two comparators 12-L0 and 12-L1, the comparator circuit 12Z includes two comparators 12-Z0 and 12-Z1, and the comparator circuit 12H includes two comparators 12-H0 and 12-H1.

Operation timings of the comparators 12-L0, 12-Z0, and 12-H0 are controlled based on a clock I corresponding to a phase of 0 degrees among four-phase clocks. The comparators 12-L0, 12-Z0, and 12-H0 determine the signal amplified by the amplifier circuit 11 based on thresholds (determination level, comparison reference voltage) and output determination results as signals DLI, DZI, and DHI respectively. Operation timings of the comparators 12-L1, 12-Z1, and 12-H1 are controlled based on a clock IX corresponding to a phase of 180 degrees among the four-phase clocks. The comparators 12-L1, 12-Z1, and 12-H1 determine the signal amplified by the amplifier circuit 11 based on thresholds (determination level, comparison reference voltage) and output determination results as signals DLIX, DZIX, and DHIX respectively. The thresholds in the comparators 12-L0, 12-Z0, and 12-H0 and the comparators 12-L1, 12-Z1, and 12-H1 are controlled by an equalizer logic circuit or the like illustrated in FIG. 5.

The comparator circuit 12C includes the number of comparators according to the number of samplings of boundary detection for a phase adjustment in a clock data recovery circuit. In this embodiment, an example of a configuration in which the clock data recovery circuit operates with a phase comparator by 2× sampling is given, and the comparator circuit 12C includes two comparators 12-C0 and 12-C1. An operation timing of the comparator 12-C0 is controlled based on a clock Q corresponding to a phase of 90 degrees among the four-phase clocks. The comparator 12-C0 outputs a determination result as a signal CLQ. An operation timing of the comparator 12-C1 is controlled based on a clock QX corresponding to a phase of 270 degrees among the four-phase clocks. The comparator 12-C1 outputs a determination result as a signal CLQX.

A timing aligner 13 synchronizes the signals to be inputted from the comparator circuits 12L, 12Z, and 12H at a timing corresponding to each of the four-phase clocks I, Q, IX, and QX and different from one another with a single clock (for example, any clock of the four-phase clocks I, Q, IX, and OX) and outputs the signals. This makes it possible that a circuit in a subsequent stage performs data processing in the single clock. A logic circuit 14, whose operation mode is switched by a control signal CTL, achieves a function of a decoder for the 4-valued PAM4 signal or a function of a selector of a one-tap decision feedback equalizer (DFE) according to the control signal CTL. In this embodiment, when the control signal CTL is "0", the logic circuit 14 operates as the decoder for the 4-valued PAM4 signal, and when the control signal CTL is "1", the logic circuit 14 operates as the selector of the one-tap DFE.

When the front end unit of the reception circuit illustrated in FIG. 1 operates as a PAM4 reception circuit which receives the 4-valued PAM4 signal, the comparators which operate with the same phase clock in the comparator circuits 12L, 12Z, and 12H determine a level of a received signal at thresholds different from one another, and output determination results as a 4-valued thermometer code. Specifically, a threshold of the comparators 12-L0 and 12-L1 which the comparator circuit 12L includes is set to a determination level which distinguishes between "00" and "01" in a PAM4 signal. A threshold of the comparators 12-Z0 and 12-Z1 which the comparator circuit 12Z includes is set to a determination level which distinguishes between "01" and "10" in the PAM4 signal. A threshold of the comparators 12-H0 and 12-H1 which the comparator circuit 12H includes is set to a determination level which distinguishes between "10" and "11" in the PAM4 signal.

Accordingly, when the PAM4 signal corresponding to a value "00" is received, all of output signals DLI, DZI, and DHI (DLIX, DZIX, and DHIX) of the comparators 12-L0, 12-Z0, and 12H0 (12-L1, 12-Z1, and 12-H1) become "0", and a thermometer code of "000" is outputted. When the PAM4 signal corresponding to a value "01" is received, the output signal DLI (DLIX) of the comparator 12-L0 (12-L1) becomes "1", and the output signals DZI and DHI (DZIX and DHIX) of the comparators 12-Z0 and 12H0 (12-Z1 and 12-H1) become "0", and a thermometer code of "001" is outputted.

When the PAM4 signal corresponding to a value "10" is received, the output signals DLI and DZI (DLIX and DZIX) of the comparators 12-L0 and 12-Z0 (12-L1 and 12-Z1) become "1", and the output signal DHI (DHIX) of the comparator 12-H0 (12-H1) becomes "0", and a thermometer code of "011" is outputted. When the PAM4 signal corresponding to a value "11" is received, all of the output signals DLI, DZI, and DHI (DLIX, DZIX, and DHIX) of the comparators 12-L0, 12-Z0, and 12H0 (12-L1, 12-Z1, and 12-H1) become "1", and a thermometer code of "111" is outputted.

Figure 2:
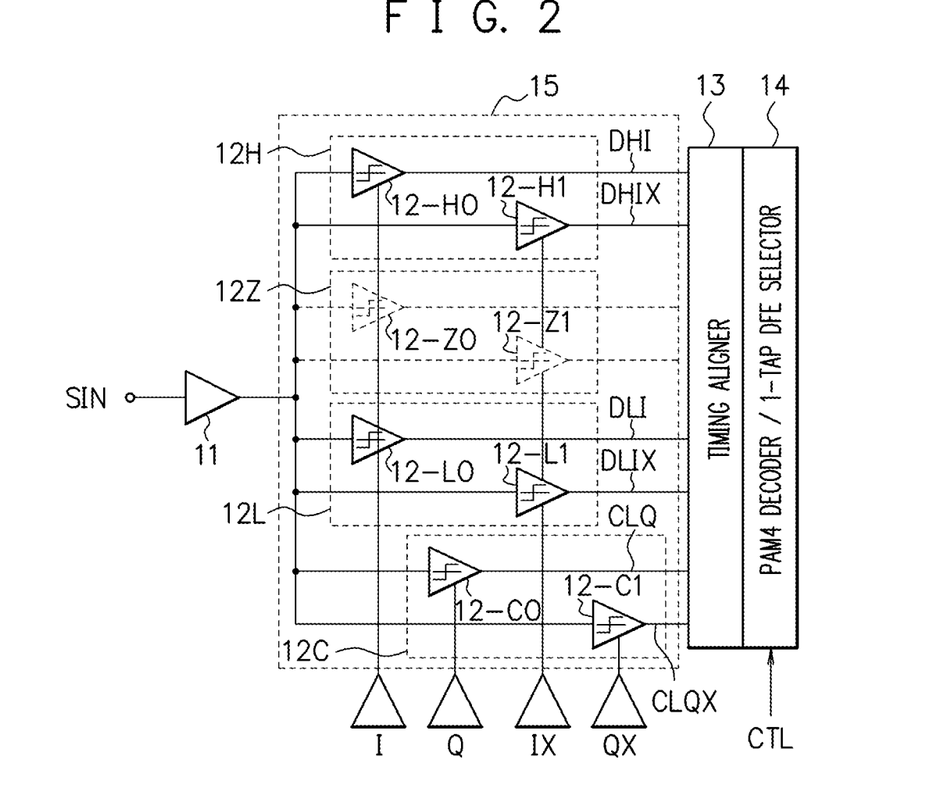
FIG. 2 is a diagram explaining an operation at a time of NRZ signal reception in this embodiment.

When the front end unit of the reception circuit illustrated in FIG. 1 operates as an NRZ reception circuit which receives the binary NRZ signal, two comparator circuits among the three comparator circuits 12L, 12Z, and 12H are operated as illustrated in FIG. 2, for example. FIG. 2 illustrates a case of operating the comparator circuits 12L and 12H as one example. Then, the comparators which operate with the same phase clock in the comparator circuits 12L and 12H determine a level of a received signal at thresholds different from each other, and output determination results. A threshold of the comparators 12-L0 and 12-L1 which the comparator circuit 12L includes is set to, for example, a threshold corresponding to "0" in a determination result before 1 unit interval (UI), and a threshold of the comparators 12-H0 and 12-H1 which the comparator circuit 12H includes is set to, for example, a threshold corresponding to "1" in a determination result before 1 UI. Note that the thresholds of the comparators 12-L0, 12-L1, 12-H0, and 12-H1 can also be set to thresholds corresponding to a determination result before 2 UI or more.

Figure 3:
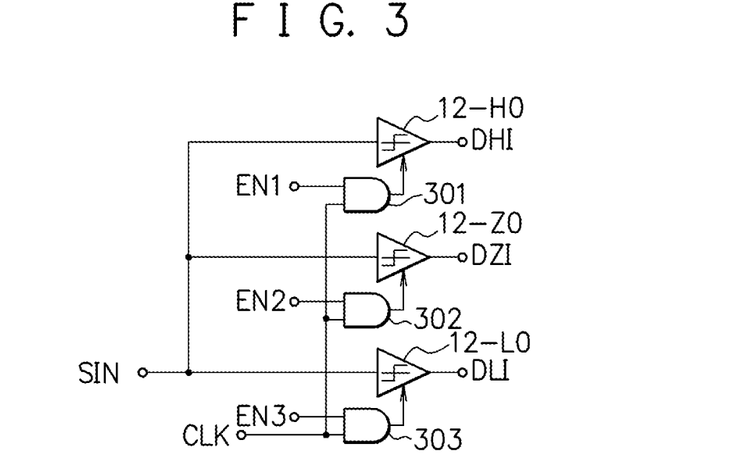
FIG. 3 is a diagram illustrating a configuration example of a circuit according to operation control of comparators in this embodiment.

In a case of operating as the NRZ reception circuit which receives the binary NRZ signal, a circuit operation of a comparator circuit (the comparator circuit 12Z in an example illustrated in FIG. 2) not to be used may be stopped (powered down). For example, as illustrated in FIG. 3, to the comparators 12-H0, 12-Z0, and 12-L0, a clock signal CLK is supplied via AND (logical product operation) gates 301, 302, and 303 to which enable signals EN1, EN2, and EN3 are inputted respectively. Note that the enable signals EN1, EN2, and EN3 are outputted from, for example, the equalizer logic circuit or the like illustrated in FIG. 5, and "1" indicates an enable state.

Then, when circuit operations of the comparators 12-H0, 12-Z0, and 12-L0 are stopped (powered down), supply of the clock signal CLK to the comparators is stopped by setting the enable signals EN1, EN2, and EN3 corresponding thereto to "0". For example, when the circuit operation of the comparator 12Z is stopped (powered down) as in the example illustrated in FIG. 2, the enable signal EN2 is set to "0". Note that a configuration of a circuit according to operation control of the comparators illustrated in FIG. 3 is one example, and is not limited to this configuration. The circuit operation of the comparator circuit not to be used may be stopped (powered down) by another circuit including a configuration different from the configuration illustrated in FIG. 3.

Figure 4A:
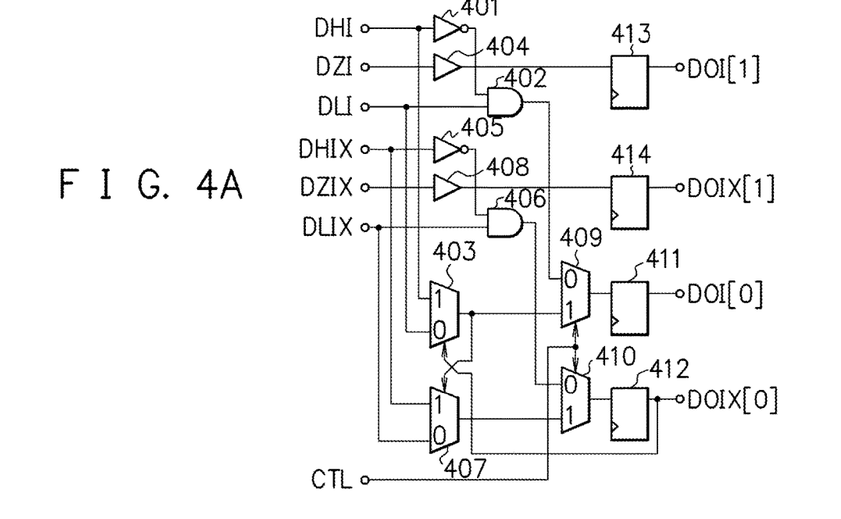
FIG. 4A is a diagram illustrating a configuration example of a logic circuit of the reception circuit in this embodiment.

FIG. 4A is a diagram illustrating one example of the logic circuit 14 illustrated in FIG. 1. The logic circuit 14 includes inverters 401 and 405, AND gates 402 and 406, selectors 403, 407, 409, and 410, buffers 404 and 408, and flip-flops 411 to 414 as illustrated in FIG. 4A. The flip-flops 411 to 414 operate with the same clock as the clock used when the timing aligner 13 synchronizes the signals from the comparator circuits 12L, 12Z, and 12H and outputs the signals.

Note that FIG. 4A illustrates an example of a case where the comparator circuits 12L and 12H are operated in operating as the NRZ reception circuit which receives the binary NRZ signal. The signals DHI, DZI, DLI, DHIX, DZIX, and DLIX are signals outputted from the timing aligner 13.

The signal DHI is inputted to the AND gate 402 via the inverter 401, and inputted to the selector 403. The signal DZI is inputted to the flip-flop 413 via the buffer 404. The signal DLI is inputted to the AND gate 402 and the selector 403. The signal DHIX is inputted to the AND gate 406 via the inverter 405, and inputted to the selector 407. The signal DZIX is inputted to the flip-flop 414 via the buffer 408. The signal DLIX is inputted to the AND gate 406 and the selector 407.

The AND gate 402 performs a logical product operation on a signal to be inputted and outputs an operation result to the selector 409. The AND gate 406 performs a logical product operation on a signal to be inputted and outputs an operation result to the selector 410. The selector 403 selects either of the signal DHI and the signal DLI and outputs to the selector 409, according to an output of the flip-flop 412. The selector 407 selects either of the signal DHIX and the signal DLIX and outputs to the selector 410, according to an output of the selector 403. Note that the reason why the output of the flip-flop 412 is used as a selection signal of the selector 403 is because the one before data outputted from the flip-flop 412 corresponds to data before 1 UI.

The selector 409 selects either of an output of the AND gate 402 and an output of the selector 403 and outputs to the flip-flop 411, according to the control signal CTL. The selector 410 selects either of an output of the AND gate 406 and an output of the selector 407 and outputs to the flip-flop 412, according to the control signal CTL. An output of the flip-flop 411 is outputted as an output signal DOI[0] (a 0th bit of an output signal DOI), and an output of the flip-flop 412 is outputted as an output signal DOIX[0] (a 0th bit of an output signal DOIX). An output of the flip-flop 413 is outputted as an output signal DOI[1] (a 1st bit of the output signal DOI), and an output of the flip-flop 414 is outputted as an output signal DOIX[1] (a 1st bit of the output signal DOIX). The output signals DOI from the flip-flops 411 and 413 and the output signals DOIX from the flip-flops 412 and 414 are supplied to a not-illustrated demultiplexer in a subsequent stage.

In this embodiment, when the output of the flip-flop 412 is "1", the selector 403 selects and outputs the signal DHI. When the output of the flip-flop 412 is "0", the selector 403 selects and outputs the signal DLI. Similarly, when the output of the selector 403 is "1", the selector 407 selects and outputs the signal DHIX. When the output of the selector 403 is "0", the selector 407 selects and outputs the signal DLIX.

When the control signal CTL is "0", namely when operating as the PAM4 reception circuit, the selector 409 selects and outputs the output of the AND gate 402. When the control signal CTL is "1", namely when operating as the NRZ reception circuit, the selector 409 selects and outputs the output of the selector 403. Similarly, when the control signal CTL is "0", namely when operating as the PAM4 reception circuit, the selector 410 selects and outputs the output of the AND gate 406. When the control signal CTL is "1", namely when operating as the NRZ reception circuit, the selector 410 selects and outputs the output of the selector 407.

The logic circuit 14 configured in this manner operates as the decoder for the 4-valued PAM4 signal as follows when the control signal CTL is "0", namely when operating as the PAM4 reception circuit. The logic circuit 14 outputs, an operation result in which a logical product operation is performed by the AND gate 402 on an inverted signal of the signal DHI which is a 2nd bit of a thermometer code obtained by sampling based on the clock I and the signal DLI which is a 0th bit thereof, as the output signal DOI[0] (the 0th bit of the output signal DOI) via the selector 409 and the flip-flop 411. Further, the logic circuit 14 outputs the signal DZI which is a 1st bit of the thermometer code obtained by sampling based on the clock I, as the output signal DOI[1](the 1st bit of the output signal DOI) via the buffer 404 and the flip-flop 413.

Similarly, the logic circuit 14 outputs, an operation result in which a logical product operation is performed by the AND gate 406 on an inverted signal of the signal DHIX which is a 2nd bit of a thermometer code obtained by sampling based on the clock IX and the signal DLIX which is a 0th bit thereof, as the output signal DOIX[0] (the 0th bit of the output signal DOIX) via the selector 410 and the flip-flop 412. Further, the logic circuit 14 outputs the signal DZIX which is a 1st bit of the thermometer code obtained by sampling based on the clock IX, as the output signal DOIX[1] (the 1st bit of the output signal DOIX) via the buffer 408 and the flip-flop 414.

Figure 4B:
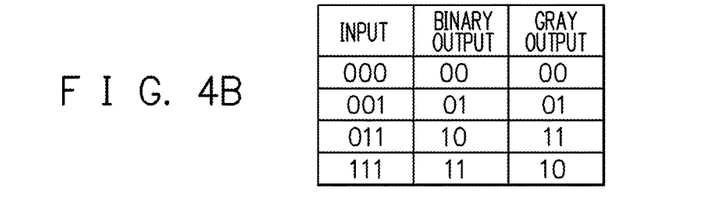
FIG. 4B is a diagram illustrating an example of outputs of the logic circuit of the reception circuit in this embodiment.

In this manner, the logic circuit 14 operates as the decoder for the 4-valued PAM4 signal, gray encodes a 3-bit thermometer code to be inputted, and converts it into a 2-bit gray code to output the 2-bit gray code as illustrated in FIG. 4B when the control signal CTL is "0", namely when operating as the PAM4 reception circuit. That is, the logic circuit 14 converts thermometer codes of "000", "001", "011", and "111" to be inputted into 2-bit data of "00", "01", "11", and "10" respectively, and outputs the 2-bit data.

Note that in this embodiment, an example in which a 3-bit thermometer code is converted into a 2-bit gray code and it is outputted is given, but this is not restrictive, and a configuration in which the 3-bit thermometer code is converted into a 2-bit binary code and it is outputted is also applicable. However, in a case of conversion into the 2-bit gray code and an output thereof, only one bit changes between the thermometer code of "001" and the thermometer code of "011", and therefore it is possible to reduce a bit error due to a determination error by the comparators 12-Z0 and 12-Z1 which output the signals DZI and DZIX.

Further, the logic circuit 14 configured as illustrated in FIG. 4A operates as the selector of the one-tap DFE in the NRZ reception circuit as follows when the control signal CTL is "1", namely when operating as the NRZ reception circuit. For example, in the logic circuit 14, the selector 403 selects the signal DHI as long as the one before output signal DOI[O] which is an output before 1 UI and is outputted from the flip-flop 412 is "1", and the signal DHI selected by the selector 403 is outputted as the output signal DOI[0] via the selector 409 and the flip-flop 411. In the logic circuit 14, the selector 403 selects the signal DLI as long as the one before output signal DOI[0] which is an output before 1 UI and is outputted from the flip-flop 412 is "0", and the signal DLI selected by the selector 403 is outputted as the output signal DOI[0] via the selector 409 and the flip-flop 411.

Similarly, in the logic circuit 14, the selector 407 selects the signal DHIX as long as the output of the selector 403 which is an output before 1 UI is "1", and the signal DHIX selected by the selector 407 is outputted as the output signal DOIX[0] via the selector 410 and the flip-flop 412. In the logic circuit 14, the selector 407 selects the signal DLIX as long as the output of the selector 403 which is an output before 1 UI is "0", and the signal DLIX selected by the selector 407 is outputted as the output signal DOIX[0] via the selector 410 and the flip-flop 412.

In this manner, the logic circuit 14 operates as the selector of the one-tap DFE which selects either of outputs of two comparator circuits (comparators) based on a determination result before 1 UI in the NRZ reception circuit, and switches a signal to be outputted according to data before 1 UI when the control signal CTL is "1", namely when operating as the NRZ reception circuit. Note that the output signals DOI[1] and DOIX[1] do not have significant information when the control signal CTL is "1", namely when operating as the NRZ reception circuit, and therefore, for example, they may be processed as invalid bits in a circuit in a subsequent stage, or the like.

According to this embodiment, comparator circuits 12 which are used for reception of the 4-valued PAM4 signal are used for reception of the binary NRZ signal, and in addition, an operation of the logic circuit 14 is switched according to whether to receive the 4-valued PAM4 signal or to receive the binary NRZ signal, and the function of the PAM4 decoder is achieved by the logic circuit 14 in a case of receiving the 4-valued PAM4 signal and the function of the selector of the one-tap DFE is achieved by the logic circuit 14 in a case of receiving the binary NRZ signal. This makes it possible to perform an operation as the NRZ reception circuit of the one-tap DFE almost without increasing a circuit scale with the PAM4 reception circuit which receives the 4-valued PAM4 signal being a basic configuration.

For example, when a reception situation in a case of the operation as the PAM4 reception circuit is not good, such control as improves a reception characteristic by switching to the NRZ signal is enabled even though a data rate is halved. Further, in a case of the operation as the NRZ reception circuit, compensation ability according to a signal loss of a transmission path improves by mounting the one-tap DFE, and for example, it is possible to greatly improve a limit (in a Nyquist frequency) of a size of a loss from about 10 dB to about 20 dB.

Note that the example of the reception circuit capable of treating the binary NRZ signal and the 4-valued PAM4 signal is given, but the embodiments are not limited to this. Changing the number of comparator circuits, or the like according to a pulse amplitude modulation signal to be received makes it possible to also apply to a combination of other pulse amplitude modulation signals in which the number of possible values is different from each other. A symbol rate of a signal to be received is not particularly prescribed, and may be different or the same in a processable range for the symbol rate according to a modulation method.

Figure 5:
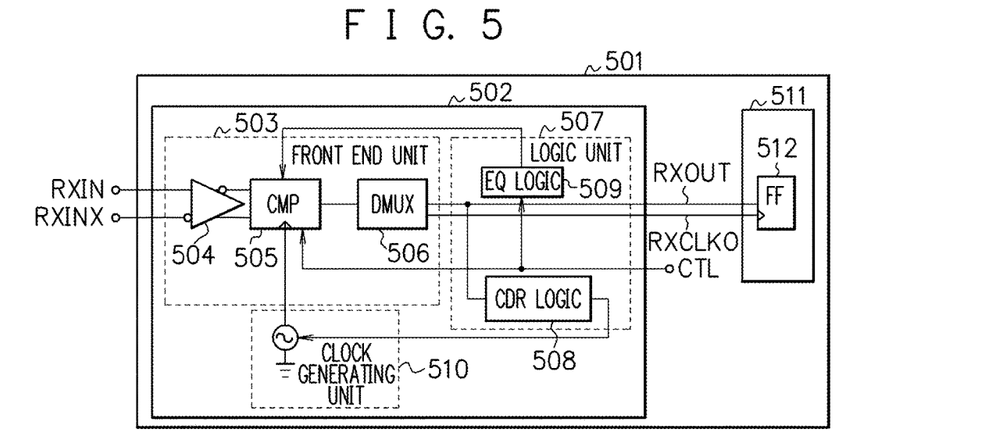
FIG. 5 is a diagram illustrating a configuration example of a semiconductor integrated circuit in this embodiment.

FIG. 5 is a diagram illustrating a configuration example of a semiconductor integrated circuit in this embodiment. A semiconductor integrated circuit 501 in this embodiment includes a reception circuit 502 including a function of a deserializer circuit which converts an input serial signal such as the binary NRZ signal or the 4-valued PAM4 signal into a parallel signal, and an internal circuit 511 such as a logic circuit which receives the parallel signal (data) from the reception circuit 502 and performs a processing operation.

The reception circuit 502 includes a front end unit 503, a logic unit 507, and a clock generating unit 510. The front end unit 503 includes a differential amplifier circuit 504, a comparator circuit 505, and a demultiplexer 506. The differential amplifier circuit 504 receives differential input serial signals RXIN and RXINX transmitted via transmission paths or the like. The comparator circuit 505 includes, for example, the comparator circuits 12, the timing aligner 13, and the logic circuit (PAM4 decoder/DFE selector) 14 which are illustrated in FIG. 1, and determines values (data) of the input serial signals. The demultiplexer 506 performs a serial-parallel conversion with respect to an output of the comparator circuit 505, outputs as a parallel signal RXOUT, and outputs a reception data clock RXCLKO.

The logic unit 507 includes a clock data recovery logic circuit 508 and an equalizer logic circuit 509. The clock data recovery logic circuit 508 controls a phase of a clock signal which the clock generating unit 510 outputs based on a received signal. The equalizer logic circuit 509 performs control related to the comparator circuit 505, controls a threshold (determination level, comparison reference voltage) in each of the comparators 12 of the comparator circuit 505, and outputs an enable signal to control the operation or the stop of the comparators 12, for example. Note that part or all of a function of controlling the threshold (determination level, comparison reference voltage) in each of the comparators 12 of the comparator circuit 505 and a function of outputting the enable signal to control the operation or the stop of the comparators 12 may be provided outside the reception circuit 502.

The comparator circuit 505 performs sampling of the input serial signal at an appropriate timing using the clock signal which the clock generating unit 510 outputs. The comparator circuit 505 and the equalizer logic circuit 509 of the reception circuit 502 are controlled by the control signal CTL, and, for example, control of an operation mode with respect to the logic circuit 14 which the comparator circuit 505 includes is performed. Note that the control signal CTL may be a fixed signal which is supplied from the outside, or a signal which an adaptive controlling logic circuit which determinates a reception situation of data and switches the operation mode (modulation method), such as an auto-negotiation function, or the like outputs. The parallel signal RXOUT to be outputted from the reception circuit 502 is taken in the internal circuit 511 by a flip-flop 512 which operates with the reception data clock RXCLKO, and processing or the like is performed.

Note that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

The disclosed reception circuit shares comparator circuits with respect to a first signal and a second signal and switches an operation of a logic circuit according to a signal to be received, and thereby it becomes possible to correspond to a plurality of modulation methods while suppressing an increase in a circuit scale of the reception circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A reception circuit comprising:
   a determination circuit including:
      a first number of first comparator circuits configured to perform determination of a level of a first data piece of a received signal based on a first clock signal among a plurality of clock signals having different phases and to output first determination signals, and
      the first number of second comparator circuits configured to perform determination of a level of a second data piece of the received signal based on a second clock signal which is different from the first clock signal among the plurality of clock signals and to output second determination signals, the second data piece being subsequent to the first data piece, the determination circuit being configured to perform determination of the level of the first data piece and the level of the second data piece by using the first number of the first comparator circuits and the first number of the second comparator circuits, respectively, when the received signal is a first signal which is a multi-valued signal and configured to perform determination of the level of the first data piece and the level of the second data piece by using a second number of the first comparator circuits and the second number of the second comparator circuits, respectively, the second number being two or more and smaller than the first number, when the received signal is a second signal, a number of possible values of the second signal being smaller than a number of possible values of the first signal;

a timing aligner circuit configured to align timing of the first determination signals and the second determination signals with one of the plurality of clock signals and to output first timing-aligned determination signals corresponding to the first determination signals and second timing-aligned determination signals corresponding to the second determination signals; and a logic circuit configured to generate digital signals based on the first and second timing-aligned determination signals, the logic circuit being configured to operate as a decoder which decodes the first and second timing-aligned determination signals and generates the digital signals when the received signal is the first signal, and configured to operate as a selector which selects one of the first timing-aligned determination signals and one of the second timing-aligned determination signals and generates the digital signals when the received signal is the second signal.

2. The reception circuit according to claim 1, wherein:
the second signal is a binary signal;
the determination circuit is further configured to perform determination of the level of the first data piece and the level of the second data piece by using two comparator circuits of the first comparator circuits and two comparator circuits of the second comparator circuits, respectively, when the received signal is the second signal, a threshold of the two comparator circuits being different from one another; and
when the received signal is the second signal, the logic circuit is configured to select a timing-aligned determination signal corresponding to one comparator circuit of the two comparator circuits and to generate the digital signals as long as data before a first period is a first value in the binary, and configured to select a timing-aligned determination signal corresponding to another comparator circuit of the two comparator circuits and to generate the digital signals as long as data before the first period is a second value in the binary.

3. The reception circuit according to claim 1, wherein:
the first number is equal to a number one smaller than the number of possible values of the first signal;
thresholds of the first number of the first comparator circuits are different from one another when the received signal is the first signal; and
thresholds of the first number of the second comparator circuits are different from one another when the received signal is the first signal.

4. The reception circuit according to claim 1, wherein an operation of one or more of the first and second comparator circuits which are not used for determination is stopped when the received signal is the second signal.

5. The reception circuit according to claim 4, wherein the operation is stopped by stopping supply of clock signals for controlling operation timing of the first and second comparator circuits to the one or more of the first and second comparator circuits.

6. The reception circuit according to claim 1, wherein the logic circuit is configured to receive a control signal which indicates whether the received signal is the first signal or the second signal, and configured to switch whether to operate as the decoder or to operate as the selector based on the control signal.

7. The reception circuit according to claim 1, wherein the logic circuit is configured to output a result of a logical operation of the first and second timing-aligned determination signals as the digital signals when the received signal is the first signal, and configured to output one of the first timing-aligned determination signals and one of the second timing-aligned determination signals which is selected based on data before a first period as the digital signals when the received signal is the second signal.

8. The reception circuit according to claim 1, wherein the first signal is a 4-valued pulse amplitude modulation signal, and the second signal is a binary pulse amplitude modulation signal.

9. The reception circuit according to claim 3, wherein an operation of one or more of the first and second comparator circuits which are not used for determination is stopped when the received signal is the second signal.

10. The reception circuit according to claim 9, wherein the operation is stopped by stopping supply of clock signals for controlling operation timing of the first and second comparator circuits to the one or more of the first and second comparator circuits.

11. A reception circuit comprising:
a determination circuit including:
a first number of first comparator circuits configured to sample a received serial signal by using a first clock signal among a plurality of clock signals having different and configured to perform determination of a level of a first data piece of the received serial signal and to output first determination signals, and
the first number of second comparator circuits configured to sample the received serial signal by using a second clock signal which is different from the first clock signal among the plurality of clock signals and configured to perform determination of a level of a second data piece of the received serial signal and to output second determination signals, the second data piece being subsequent to the first data piece,
the determination circuit being configured to perform determination of the level of the first data piece and the level of the second data piece by using the first number of the first comparator circuits and the first number of the second comparator circuits, respectively, when the received serial signal is a first signal which is a multi-valued signal, and configured to perform determination of the level of the first data piece and the level of the second data piece by using a second number of the first comparator circuits and the second number of the second comparator circuits, respectively, the second number being two or more and smaller than the first number, when the received serial signal is a second signal, a number of possible values of the second signal being smaller than a number of possible values of the first signal;

a timing aligner circuit configured to align timing of the first determination signals and the second determination signals with one of the plurality of clock signals and output first timing-aligned determination signals corresponding to the first determination signals and second timing-aligned determination signals corresponding to the second determination signals;

a logic circuit configured to generate digital signals based on the first and second timing-aligned determination signals, the logic circuit being configured to operate as a decoder which decodes the first and second timing-aligned determination signals and generates the digital signals when the received serial signal is the first signal, and configured to operate as a selector which selects one of the first timing-aligned determination signals and one of the second timing-aligned determination signals and generates the digital signals when the received serial signal is the second signal;

a demultiplexer configured to perform a serial-parallel conversion with respect to the digital signals generated by the logic circuit and output a parallel signal; and a clock data recovery circuit configured to control a phase of at least one of the plurality of clock signals based on an output signal of the demultiplexer.

12. A semiconductor integrated circuit comprising:

a determination circuit including:

a first number of first comparator circuits configured to sample a received serial signal by using a first clock signal among a plurality of clock signals having different phases and configured to perform determination of a level of a first data piece of the received serial signal and output first determination signals, and the first number of second comparator circuits configured to sample the received serial signal by using a second clock signal which is different from the first clock signal among the plurality of clock signals and configured to perform determination of a level of a second data piece of the received serial signal and output second determination signals, the second data piece being subsequent to the first data piece, the determination circuit being configured to perform determination of the level of the first data piece and the level of the second data piece by using the first number of the first comparator circuits and the first number of the second comparator circuits, respectively, when the received serial signal is a first signal which is a multi-valued signal, and configured to perform determination of the level of the first data piece and the level of the second data piece by using a second number of the first comparator circuits and the second number of the second comparator circuits, respectively, the second number being two or more and smaller than the first number, when the received serial signal is a second signal, a number of possible values of the second signal being smaller than a number of possible values of the first signal;

a timing aligner circuit configured to align timing of the first determination signals and the second determination signals with one of the plurality of clock signals and output first timing-aligned determination signals corresponding to the first determination signals and second timing-aligned determination signals corresponding to the second determination signals;

a logic circuit configured to generate digital signals based on the first and second timing-aligned determination signals, the logic circuit being configured to operate as a decoder which decodes the first and second timing-aligned determination signals and generates the digital signals when the received serial signal is the first signal, and configured to operate as a selector which selects one of the first timing-aligned determination signals and one of the second timing-aligned determination signals and generates the digital signals when the received serial signal is the second signal;

a demultiplexer configured to perform a serial-parallel conversion with respect to the digital signals generated by the logic circuit and output a parallel signal;

a clock data recovery circuit configured to control a phase of at least one of the plurality of clock signals based on an output signal of the demultiplexer; and an internal circuit configured to receive the parallel signal from the demultiplexer and perform a processing operation.

13. The semiconductor integrated circuit according to claim 12, wherein:

the second signal is a binary signal;

the determination circuit is configured to perform determination of the level of the first data piece and the level of the second data piece by using two comparator circuits of the first comparator circuit and two comparator circuits of the second comparator circuits respectively, when the received serial signal is the second signal, a threshold of the two comparator circuits being different from one another; and when the received serial signal is the second signal, the logic circuit is configured to select a timing-aligned determination signal corresponding to one comparator circuit of the two comparator circuits and generate the digital signals as long as data before a first period is a first value in the binary, and configured to select a timing-aligned determination signal corresponding to another comparator circuit of the two comparator circuits and to generate the digital signals as long as data before the first period is a second value in the binary.

14. The semiconductor integrated circuit according to claim 12, wherein:

the first number is equal to a number one smaller than the number of possible values of the first signal;

thresholds of the first number of the first comparator circuits are different from one another when the received serial signal is the first signal; and thresholds of the first number of the second comparator circuits are different from one another when the received serial signal is the first signal.

15. The semiconductor integrated circuit according to claim 12, wherein an operation of one or more of the first and second comparator circuits which are not used for determination is stopped when the received serial signal is the second signal.

16. The semiconductor integrated circuit according to claim 15, wherein the operation is stopped by stopping supply of clock signals for controlling operation timing of the first and second comparator circuits to the one or more of the first and second comparator circuits.

17. The semiconductor integrated circuit according to claim 12, wherein the logic circuit is configured to receive a control signal which indicates whether the received serial signal is the first signal or the second signal, and configured to switch whether to operate as the decoder or to operate as the selector based on the control signal.

18. The semiconductor integrated circuit according to claim 12, wherein the logic circuit is configured to output a result of a logical operation of the first and second timing-aligned determination signals as the digital signals when the received serial signal is the first signal, and configured to output one of the first timing-aligned determination signals and one of the second timing-aligned determination signals which is selected based on data before a first period as the digital signals when the received serial signal is the second signal.

19. The semiconductor integrated circuit according to claim 12, wherein the first signal is a 4-valued pulse amplitude modulation signal, and the second signal is a binary pulse amplitude modulation signal.

* * * * *